(12) United States Patent
Choi et al.

(10) Patent No.: US 9,704,610 B2
(45) Date of Patent: Jul. 11, 2017

(54) MANGANESE TIN OXIDE BASED TRANSPARENT CONDUCTING OXIDE AND TRANSPARENT CONDUCTIVE FILM AND METHOD FOR FABRICATING TRANSPARENT CONDUCTIVE FILM USING THE SAME

(71) Applicant: Korea Institute of Science and Technology, Seoul (KR)

(72) Inventors: Ji-Won Choi, Seoul (KR); Won-Kook Choi, Seoul (KR); Jin Sang Kim, Seoul (KR); Haena Yim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/014,937

(22) Filed: Feb. 3, 2016

(65) Prior Publication Data

US 2016/0225479 A1  Aug. 4, 2016

(30) Foreign Application Priority Data

Feb. 4, 2015  (KR) .................. 10-2015-0017286

(51) Int. Cl.
*B32B 15/04* (2006.01)
*C23C 14/06* (2006.01)
(Continued)

(52) U.S. Cl.
CPC ............... *H01B 1/02* (2013.01); *C01G 19/02* (2013.01); *H01L 29/43* (2013.01);
(Continued)

(58) Field of Classification Search
USPC ....... 428/426, 428, 432, 688, 689, 697, 698, 428/699, 701, 702; 204/192.1
See application file for complete search history.

(56) References Cited

U.S. PATENT DOCUMENTS

2008/0308151 A1* 12/2008 Den Boer ......... H01L 31/02168
136/256
2013/0292668 A1* 11/2013 Oh ................... H01L 29/66969
257/43

FOREIGN PATENT DOCUMENTS

KR         2002-0096536 A    12/2002
KR    10-2009-0122546 A    12/2009
(Continued)

OTHER PUBLICATIONS

Brahma, Rajeeb, et al. "Optical, structural and electrical properties of Mn doped tin oxide thin films." Bulletin of Materials Science 29.3 (2006): 317-322.
(Continued)

*Primary Examiner* — Lauren R Colgan
(74) *Attorney, Agent, or Firm* — NSIP Law

(57) ABSTRACT

Disclosed is a manganese tin oxide-based transparent conducting oxide (TCO) with an optimized composition, which has low surface roughness, low sheet resistance and high transmittance even when deposited at room temperature, a multilayer transparent conductive film using the same and a method for fabricating the same. The manganese tin oxide-based transparent conducting oxide has a composition of $Mn_xSn_{1-x}O$ ($0<x\leq0.055$), and the multilayer transparent conductive film includes: a manganese tin oxide-based transparent conducting oxide having a composition of $Mn_xSn_{1-x}O$ ($0<x\leq0.055$); a metal thin film deposited on the manganese tin oxide-based transparent conducting oxide; and a manganese tin oxide-based transparent conducting oxide having a composition of $Mn_xSn_{1-x}O$ ($0<x\leq0.055$) deposited on the metal thin film.

17 Claims, 6 Drawing Sheets

(51) Int. Cl.
  *H01B 1/02*      (2006.01)
  *H01L 29/43*     (2006.01)
  *H01L 31/0224*   (2006.01)
  *C01G 19/02*     (2006.01)
  *H01L 31/18*     (2006.01)
  *H01L 33/42*     (2010.01)

(52) U.S. Cl.
  CPC .. *H01L 31/022466* (2013.01); *H01L 31/1884* (2013.01); *C01P 2002/50* (2013.01); *C01P 2002/54* (2013.01); *H01L 33/42* (2013.01); *Y02E 10/50* (2013.01)

(56) References Cited

FOREIGN PATENT DOCUMENTS

| | | | |
|---|---|---|---|
| KR | 10-2012-0028505 A | 3/2012 | |
| KR | 10-1273798 B1 | 6/2013 | |

OTHER PUBLICATIONS

Ghodsi, F. E., et al. "Optical, electrical and morphological properties of p-type Mn-doped SnO2 nanostructured thin films prepared by sol-gel process." Applied Physics A 108.3 (2012): 693-700.

Azam, Ameer, et al. "Investigation of electrical properties of Mn doped tin oxide nanoparticles using impedance spectroscopy." Journal of Applied Physics 108.9 (2010): 094329. (8 pages in English).

Lee, Chung-Hyeon, et al. "Nano-sized indium-free MTO/Ag/MTO transparent conducting electrode prepared by RF sputtering at room temperature for organic photovoltaic cells." Solar Energy Materials and Solar Cells 132 (2015): 80-85. (6 pages in English).

Yu, Shihui, et al. "Characterization of SnO 2/Cu/SnO 2 multilayers for high performance transparent conducting electrodes." Thin Solid Films 562 (2014): 501-505.

\* cited by examiner

Fig.1
(a) Single crystal
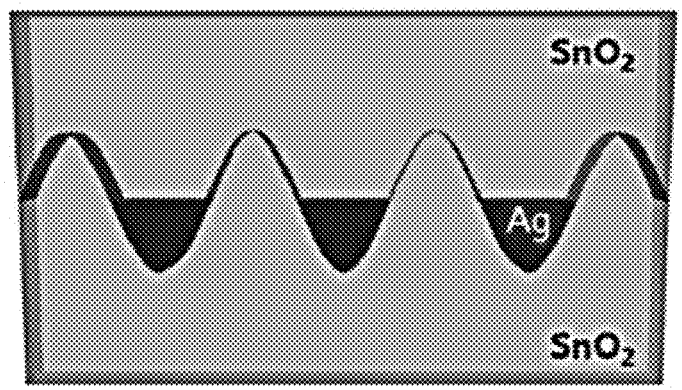
(b) Poly crystal
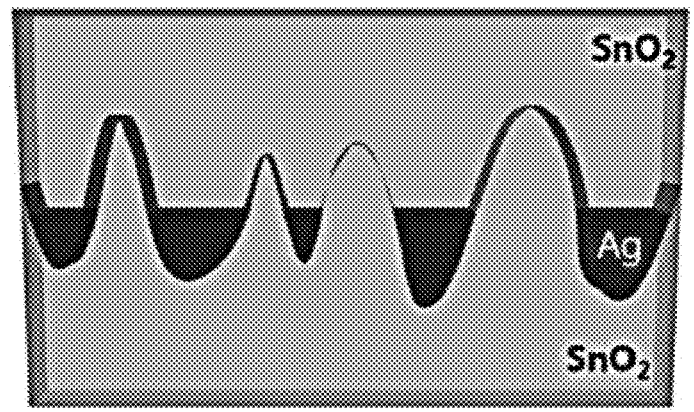
(c) Amorphous
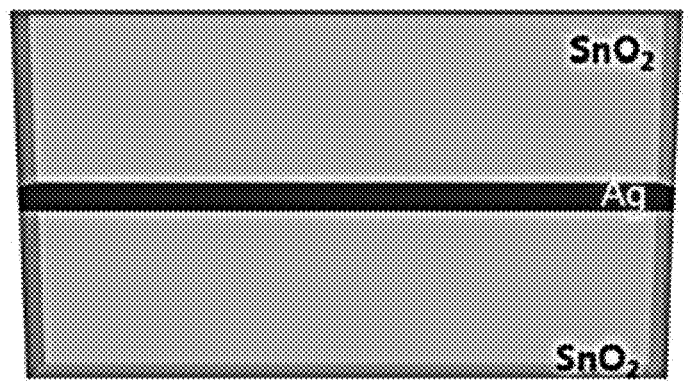

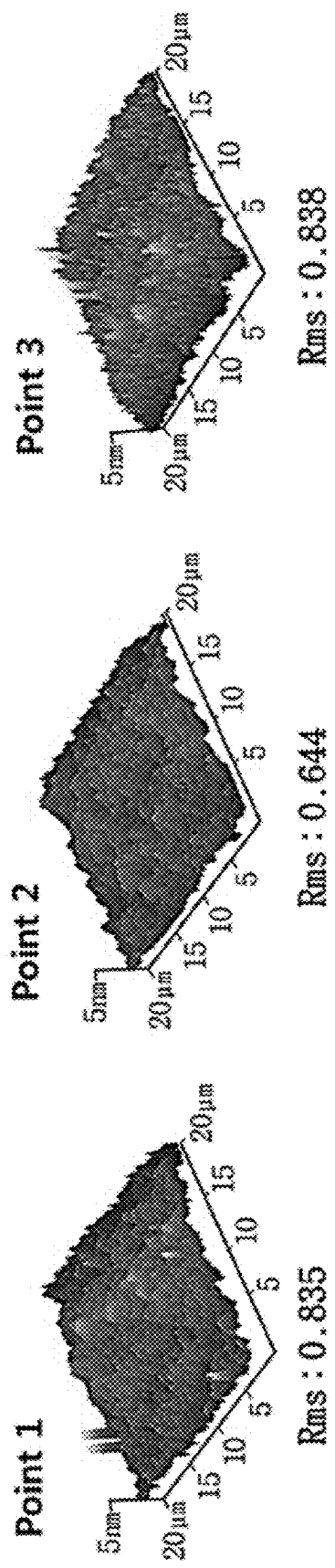

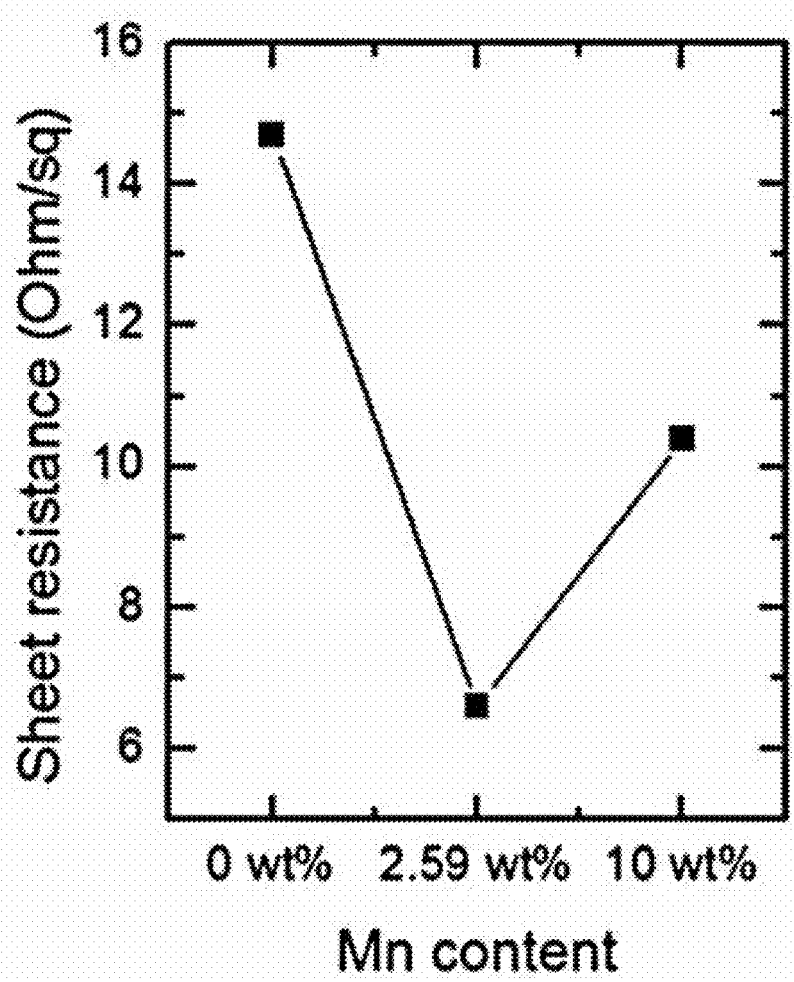

MANGANESE TIN OXIDE BASED TRANSPARENT CONDUCTING OXIDE AND TRANSPARENT CONDUCTIVE FILM AND METHOD FOR FABRICATING TRANSPARENT CONDUCTIVE FILM USING THE SAME

CROSS-REFERENCE TO RELATED APPLICATION

This application claims the priority of Korean Patent Application No. 10-2015-0017286, filed on Feb. 4, 2015, and all the benefits accruing therefrom under 35 U.S.C. §119, the contents of which in its entirety are herein incorporated by reference.

BACKGROUND

1. Field

The present disclosure relates to a manganese tin oxide-based transparent conducting oxide, a multilayer transparent conductive film using the same and a method for fabricating the same. More particularly, it relates to a manganese tin oxide-based transparent conducting oxide (TCO) with an optimized composition, which has low surface roughness, low sheet resistance and high transmittance even when deposited at room temperature, a multilayer transparent conductive film using the same and a method for fabricating the same.

[Description about National Research and Development Support]

This study was supported by the Ministry of Trade, Industry and Energy, Republic of Korea (Global Professional Technology Development Business, Project No. 1415135423) under the superintendence of Korea Evaluation Institute of Industrial Technology.

2. Description of the Related Art

Transparent conducting oxides (TCO) are important materials used in plasma panel displays (PDPs), light-emitting diodes, various touch panels, etc. Recently, interests in and researches on transparent electrodes are increasing with the development of optical devices, thin-film transistors, thin-film solar cells, etc. The research and commercialization of thin-film TCO materials began in the 1960s. In general, oxide-based materials in which $SnO_2$, $In_2O_3$, ZnO, etc. are doped with dopants have been developed as optically transparent and conducting materials.

Among them, the Sn-doped $In_2O_3$ (ITO, indium tin oxide)-based thin film, which exhibits high work function, superior electrical conductivity, high transmittance, superior adhesion to a substrate and good etchability, is the most commercialized material mainly for flat panel displays (see Korean Patent Publication No. 2002-96536).

However, the worldwide reserve of indium (In), the main component of ITO, is low and indium (In) is expected to be depleted soon because the demand on ITO is increasing with the recent development of optical device industries. Therefore, the price competitiveness of the device has decreased. In addition, when the ITO thin film is deposited at low temperature, sheet resistance increases due to very high defect density because of decreased chemical stability. Accordingly, it is not suitable for fabrication through a low-temperature process and is inapplicable to flexible devices which are regarded as key display devices in the future. Because a plastic substrate with low thermal resistance is used for application to flexible devices, it is inapplicable to a high-temperature process because deformation occurs easily at a specific temperature or more.

For these reasons, researches have been conducted on materials that can replace ITO electrodes. Many researchers have studied transparent conducting oxide (TCO) materials not containing indium (In) such as Al-doped ZnO, Ga-doped ZnO, etc., which are abundant, pollution-free and thermally stable, to replace ITO.

However, up to now available non-indium-based transparent conducting oxides are inferior to ITO in its electrical and optical properties such as high resistance for room-temperature processes and requiring a film thickness of 200 nm or more to obtain an electrode with low resistance.

To resolve the problem of low electrical and optical properties of non-indium-based transparent conducting oxides for room-temperature processes, researches are actively under way on multilayer thin films with a structure of TCO/metal layer/TCO wherein a metal layer is disposed between transparent conducting oxide (TCO) thin films. The metal layer inserted in these multilayer thin films can decrease the electrical resistance of the overall thin film and may enhance transmittance through an anti-reflection effect of inhibiting reflection from the metal layer. As for the metal layer inserted in the multilayer thin film, silver (Ag) which absorbs less light in the visible region is used the most widely. When the metal layer inserted between the TCO layers is deposited in vacuo, the metal layer is deposited after forming islands. That is to say, it is known that, after the islands are formed first, then the islands are combined as a single uniform layer to form a continuous film. When the Ag thin film is deposited through magnetron sputtering, a continuous thin film is formed stably when the film thickness is 10 nm or more, while the film thickness increases, transmittance decreases. Therefore, the thickness of the metal layer of about 10 nm is applied.

Since the multilayer thin film is applied with such thin thickness, the interfacial roughness between the TCO and the metal layer greatly affects the electrical and optical properties of the multilayer thin film. When the transparent conducting oxide (TCO) thin film is in crystalline (e.g., single crystalline or polycrystalline) phase, the metal layer cannot be deposited uniformly due to large surface roughness (for example, RMS of several tens of nanometers), as shown in FIG. 1. As a result, electron mobility may be decreased and to this end electrical resistance may be eventually increased because the electron transport path in the metal layer is interrupted by the interface.

SUMMARY

The present disclosure is directed to providing a manganese tin oxide-based transparent conducting oxide (TCO) with an optimized composition, which has low surface roughness, low sheet resistance and high transmittance even when deposited at room temperature, a multilayer transparent conductive film using the same and a method for fabricating the same.

In an aspect, the present disclosure provides a manganese tin oxide-based transparent conducting oxide having a composition of $Mn_xSn_{1-x}O$ (0<x≤0.055).

The x may be 0.035-0.055. More specifically, the x may be 0.045.

In another aspect, the present disclosure provides a multilayer transparent conductive film, including: a manganese tin oxide-based transparent conducting oxide having a composition of $Mn_xSn_{1-x}O$ (0<x≤0.055); a metal thin film deposited on the manganese tin oxide-based transparent conducting oxide; and a manganese tin oxide-based transparent conducting oxide having a composition of $Mn_xSn_{1-x}O$ (0<x≤0.055) deposited on the metal thin film.

The metal thin film may be one of Ag, Au, Cu, Pd, Pt, Ni, Al, Y, La, Mg, Ca, Fe, Pb and Zn or an alloy thereof. The manganese tin oxide-based transparent conducting oxide may have a thickness of 20-200 nm and the metal thin film may have a thickness of 5-50 nm.

In another aspect, the present disclosure provides a method for fabricating a multilayer transparent conductive film, including: depositing a manganese tin oxide-based transparent conducting oxide having a composition of $Mn_xSn_{1-x}O$ (0<x≤0.055) on a substrate; depositing a metal thin film on the manganese tin oxide-based transparent conducting oxide; and depositing a manganese tin oxide-based transparent conducting oxide having a composition of $Mn_xSn_{1-x}O$ (0<x≤0.055) on the metal thin film.

The substrate may be a glass substrate or a polymer substrate, and the polymer substrate may be made of polyester, polyethylene, polycarbonate or polyethylene terephthalate.

The manganese tin oxide-based transparent conducting oxide of the present disclosure may have superior surface roughness, provide stable electrical and optical properties and can be fabricated at low cost as compared to the ITO-based transparent conductive film. And, the multilayer transparent conductive film of the present disclosure may exhibit superior electrical and optical properties even with a small thickness and may be applicable to a glass substrate or a polymer substrate because deposition at room temperature is possible.

BRIEF DESCRIPTION OF THE DRAWINGS

FIG. 1 is a schematic view for explaining a surface roughness of a transparent conducting oxide in crystalline and amorphous phases.

FIG. 4a shows a surface roughness of a $MnO_2$—$SnO_2$-based thin film layer having a continuous composition at three points.

FIG. 5 shows a sheet resistance graph of pure $SnO_2$ and a Mn-doped $SnO_2$ multilayer transparent conductive film.

DETAILED DESCRIPTION

The example embodiments of the present disclosure provides a transparent conducting oxide (TCO) having a composition of $Mn_xSn_{1-x}O$ (0<x≤0.055) and a multilayer transparent conductive film with a TCO/metal thin film/TCO structure in which the transparent conducting oxide (TCO) having the composition and a metal thin film are deposited alternately.

The transparent conducting oxide (TCO) having a composition of $Mn_xSn_{1-x}O$ (0<x≤0.055) according to the example embodiments of the present disclosure has low surface roughness even when deposited at room temperature, not to speak of at high temperature, and exhibits superior electrical properties due to the low surface roughness. The low surface roughness improves electron mobility at the interface between the transparent conducting oxide (TCO) and the metal thin film, thereby improving the electrical properties of the multilayer transparent conductive film having the TCO/metal thin film/TCO structure.

The transparent conducting oxide (TCO) according to the example embodiments of the present disclosure has a composition of $Mn_xSn_{1-x}O$ (0<x≤0.055). As seen from 0<x≤0.055, the composition is obtained as a trace amount of Sn in $SnO_2$ is replaced by Mn.

The electrical and optical properties of the transparent conducting oxide (TCO) are secured when it has a composition of $Mn_xSn_{1-x}O$ (0<x≤0.055). When the compositional ratio of Mn exceeds 0.055, the electrical and optical properties may worsen due to an increased surface roughness.

In an example embodiment of the present disclosure, a RMS (Root Mean Square) surface roughness of the transparent conducting oxide (TCO) thin film having the composition of $Mn_xSn_{1-x}O$ (0<x≤0.055), for example, may be 0.6-0.85 nm, preferably 0.6-0.8 nm.

In an example embodiment of the present disclosure, a sheet resistance of the transparent conducting oxide (TCO) thin film having the composition of $Mn_xSn_{1-x}O$ (0<x≤0.055), for example, may be 6.6~10.4 $\Omega/cm^2$.

In an example embodiment of the present disclosure, a transmittance of the transparent conducting oxide (TCO) thin film having the composition of $Mn_xSn_{1-x}O$ (0<x≤0.055), for example, may be 82~86%.

From the experiments of the present disclosure, it has been found out that optimum electrical and optical properties are achieved when the compositional ratio of Mn is 0.035-0.055, in particular 0.045, with a transmittance of 86% and a sheet resistance of 6.6 $\Omega/cm^2$. For reference, when the compositional ratio of Mn is 0.045, Mn accounts for 2.59 wt % in the $Mn_xSn_{1-x}O$.

In the embodiments of the present disclosure, the optimized composition of $Mn_xSn_{1-x}O$ (0<x≤0.055) was determined by forming a $MnO_2$—$SnO_2$-based thin film layer having a continuous composition ($Mn_xSn_{1-x}O$ (0≤x≤1)), and comparting the thin film layer into plural zones, and then measuring the electrical and optical properties of the each zones of the thin film layer.

Figure 2:
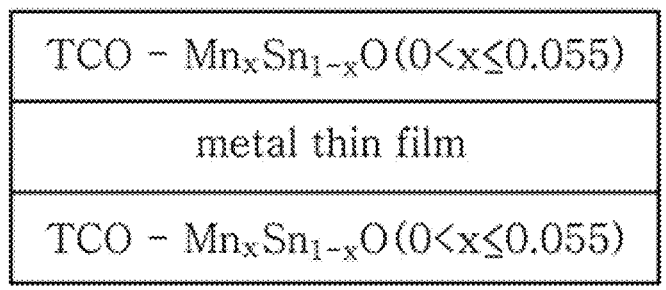
FIG. 2 is a schematic view of a multilayer transparent conductive film according to an example of the present disclosure.

The multilayer transparent conductive film having a TCO/metal thin film/TCO structure, wherein the transparent conducting oxide (TCO) having a composition of $Mn_xSn_{1-x}O$ (0<x≤0.055) according to the embodiments of the present disclosure has been applied (see FIG. 2), may exhibit superior electrical and optical properties. Because the transparent conducting oxide (TCO) having a composition of $Mn_xSn_{1-x}O$ (0<x≤0.055) of the embodiments of the present disclosure has low surface roughness and high transmittance even with a small thickness of 20-200 nm, the multilayer transparent conductive film having the TCO/metal thin film/TCO structure may secure superior electrical and optical properties.

The multilayer transparent conductive film having the TCO/metal thin film/TCO structure is designed such that the transparent conducting oxide (TCO) has a thickness of 20-200 nm and the metal thin film has a thickness of 5-50 nm. When the thickness of the metal thin film is less than 5 nm, it is difficult to form a uniform film. And, when it exceeds 50 nm, transmittance may decrease. The metal thin film may reflect most of incident light and hardly transmit it due to low refractive index and large extinction coefficient when it exists as a single layer. But, when it is disposed between the transparent conducting oxides (TCO), light reflection is reduced since the traveling properties of light changes in the medium. As the metal thin film, one of Ag, Au, Cu, Pd, Pt, Ni, Al, Y, La, Mg, Ca, Fe, Pb and Zn or an alloy thereof may be used.

Because the transparent conducting oxide (TCO) having a composition of $Mn_xSn_{1-x}O$ ($0<x\leq0.055$) according to the embodiments of the present disclosure can be deposited at room temperature as described above, it can be applied onto a polymer substrate made of polycarbonate (PC), polyethylene terephthalate (PET), polyester, polyethylene, etc. Accordingly, it can be used as a transparent electrode of a flexible device. The transparent conducting oxide (TCO) or the multilayer transparent conductive film having the TCO/metal thin film/TCO structure can be deposited through various deposition processes such as sputtering, CVD, PVD, etc.

The manganese tin oxide-based transparent conducting oxide (TCO) according to embodiments of the present disclosure, the multilayer transparent conductive film using the same and the fabrication method thereof are described in more detail through the following examples.

Example 1: Determination of Optimized Composition by Continuous Composition Spread Method A 75 mm×15 mm glass substrate was positioned in an off-axis continuous composition spread sputtering device wherein two sputter gun were arranged with an angle of 90 degrees. 2-inch $SnO_2$ target and $MnO_2$ target were mounted for each sputter gun. After creating a high-vacuum atmosphere of about $2\times10^{-6}$ Torr using a rotary pump and a turbomolecular pump, argon (Ar) gas was injected and sputtering was conducted at a pressure of 45 mTorr. The $SnO_2$ target was sputtered at 40 W and the $MnO_2$ target was sputtered at 10 W, for 1 hour, respectively. Before the thin film deposition, pre-sputtering was conducted for 15 minutes.

Through the sputtering, a thin film layer was formed on the glass substrate. The $SnO_2$ target and the $MnO_2$ target were used, and a $MnO_2$—$SnO_2$-based thin film layer having a continuous composition of $Mn_xSn_{1-x}O$ ($0\leq x\leq1$) was formed. In the formed $MnO_2$—$SnO_2$-based thin film layer, the substrate portion close to the $MnO_2$ target was relatively rich in $MnO_2$ and the substrate portion close to the $SnO_2$ was relatively rich in $SnO_2$. Also, the thickness of the thin film layer formed on the substrate portions close to the each targets were relatively thicker than that of the thin film formed on the middle portion of the substrate.

Figure 3:
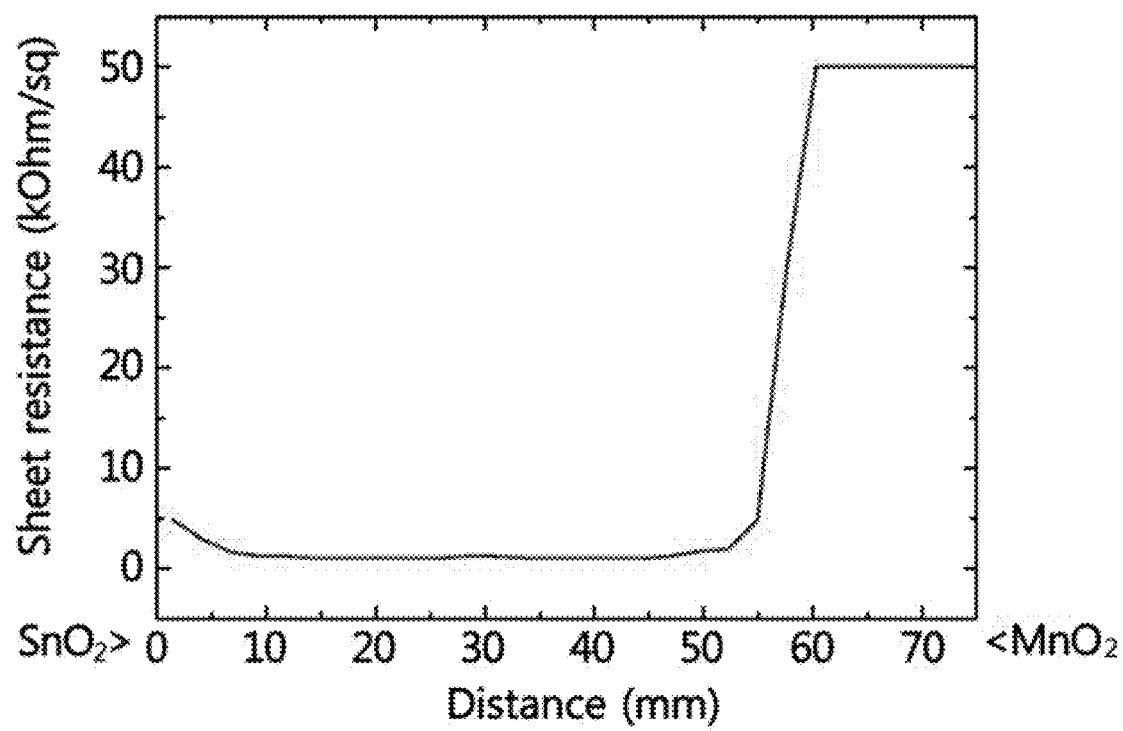
FIG. 3 shows a sheet resistance graph of a $MnO_2$—$SnO_2$-based thin film layer having a continuous composition.

The sheet resistance of the $MnO_2$—$SnO_2$-based thin film layer having a continuous composition was measured. As seen from FIG. 3, the sheet resistance increased as the content of $MnO_2$ increase, and the electrical properties were improved as the $SnO_2$ content increases. It can be seen that the $MnO_2$—$SnO_2$-based thin film layer exhibits low sheet resistance in a broad range. Of the total width 75 mm of the thin film layer, the zone corresponding to 10-55 mm showed sheet resistance of about 6.6 $\Omega/cm^2$. In the zone past 55 mm (i.e., in the zone where Mn content was 3.17 wt % or more), the sheet resistance increased rapidly.

Figure 4B:
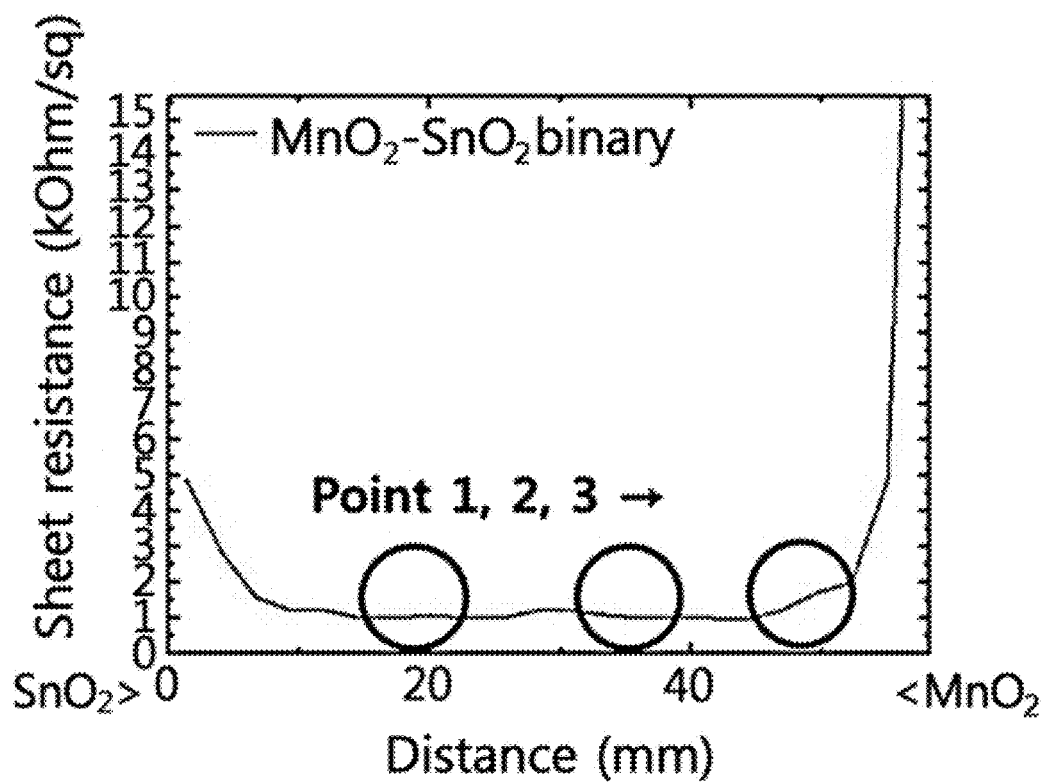
FIG. 4b shows a sheet resistance graph of a $MnO_2$—$SnO_2$-based thin film layer having a continuous composition where the three points are indicated.

In addition, the surface roughness of the $MnO_2$—$SnO_2$-based thin film layer having a continuous composition was analyzed by atomic force microscopy (AFM). From FIG. 4a, the $MnO_2$—$SnO_2$-based thin film layer having a continuous composition had an amorphous phase. When RMS was measured for three points ('Point 1', 'Point 2' and 'Point 3' in FIGS. 4a and 4b) randomly chosen from the 10-55 mm zone of overall 75 mm thin film layer, the RMS value was very low as 0.644-0.838 nm. Also, the $MnO_2$—$SnO_2$-based thin film layer having a continuous composition had a transmittance of 80% or higher in the visible region.

From the experimental results on the $MnO_2$—$SnO_2$-based thin film layer having a continuous composition, the most superior properties were observed when the composition was $Mn_{0.045}Sn_{0.955}O$. The composition $Mn_{0.045}Sn_{0.955}O$ corresponds to $SnO_2$ containing 2.59 wt % of Mn.

Example 2: Deposition and Characterization of Multilayer Transparent Conductive Film A transparent conducting oxide (TCO), a metal thin film and a transparent conducting oxide (TCO) were deposited sequentially on a glass substrate. The transparent conducting oxide (TCO) was Mn-doped $SnO_2$ and the metal thin film was Ag. That is to say, a multilayer transparent conductive film with a Mn-doped $SnO_2$/Ag/Mn-doped $SnO_2$ structure was formed on a glass substrate through sputtering deposition at room temperature.

The Mn-doped $SnO_2$ was deposited using a $SnO_2$ target containing 2.59 wt % of Mn. For comparison, three different multilayer transparent conductive films of 2.59 wt % Mn-doped $SnO_2$/Ag/2.59 wt % Mn-doped $SnO_2$, 10 wt % Mn-doped $SnO_2$/Ag/10 wt % Mn-doped $SnO_2$ and $SnO_2$/Ag/$SnO_2$ were formed by depositing 2.59 wt % Mn-doped $SnO_2$, 10 wt % Mn-doped $SnO_2$ and $SnO_2$, respectively.

An on-axis sputtering device was used and the deposition was conducted under an argon (Ar) atmosphere at a pressure of 5 mTorr. The target power was 30 W. The top and bottom TCOs were deposited to a thickness of 50 nm and the Ag was deposited to a thickness of 12 nm. The total thickness of the multilayer transparent conductive film was 112 nm.

The electrical properties of the deposited three multilayer transparent conductive films were analyzed by the four-point probe method, hall measurement and UV/Vis spectrometry.

The sheet resistance of the 2.59 wt % Mn-doped $SnO_2$/Ag/2.59 wt % Mn-doped $SnO_2$, the 10 wt % Mn-doped $SnO_2$/Ag/10 wt % Mn-doped $SnO_2$ and the $SnO_2$/Ag/$SnO_2$ was 6.6 $\Omega/cm^2$, 10.4 $\Omega/cm^2$ and 14.7 $\Omega/cm^2$, respectively. The sheet resistance was superior for the Mn-doped $SnO_2$ to the pure $SnO_2$. But, when Mn was doped in excess (10 wt %), the electrical property of the thin film worsened (see FIG. 5).

Figure 6:
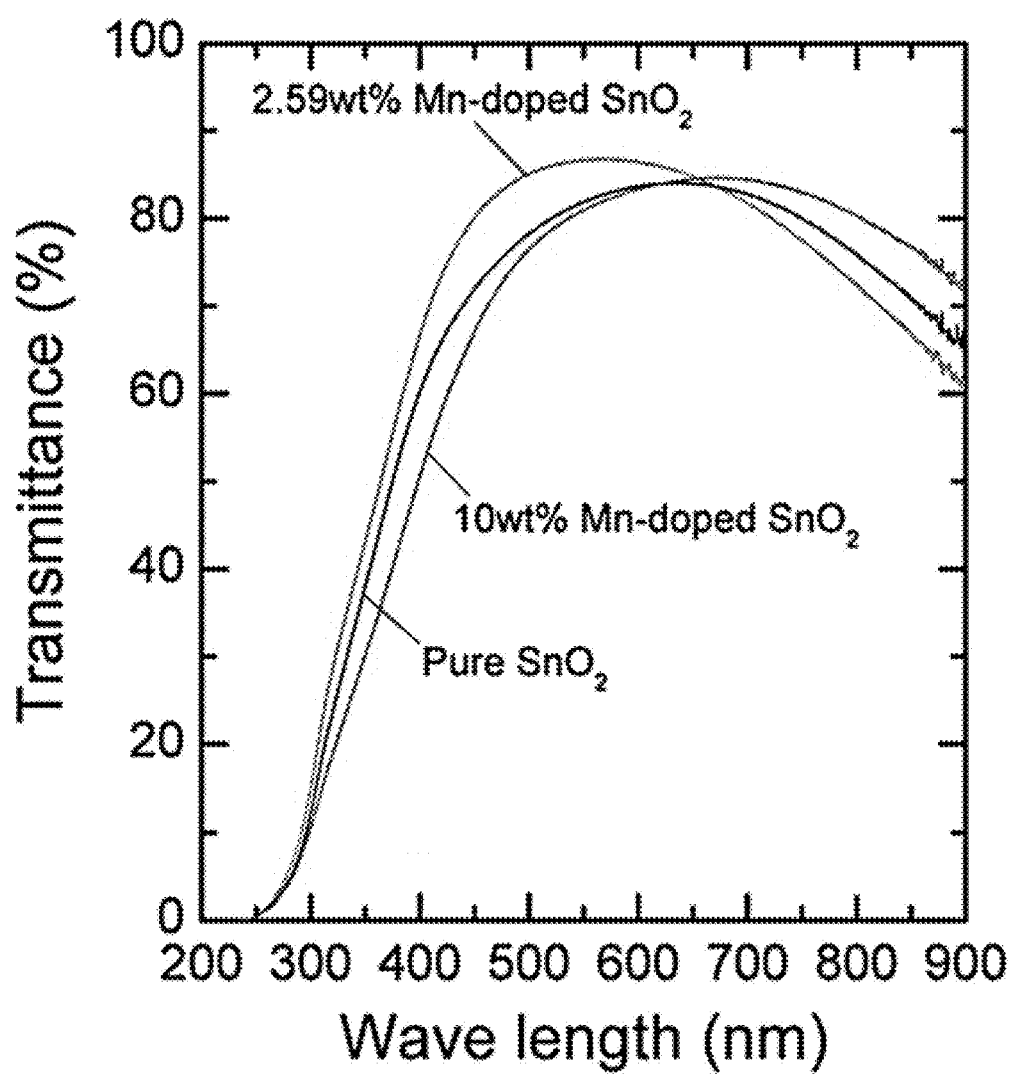
FIG. 6 shows a transmittance graph of pure $SnO_2$ and a Mn-doped $SnO_2$ multilayer transparent conductive film.

The transmittance of the multilayer transparent conductive films was 86%, 81% and 82% for the 2.59 wt % Mn-doped $SnO_2$/Ag/2.59 wt % Mn-doped $SnO_2$, the 10 wt % Mn-doped $SnO_2$/Ag/10 wt % Mn-doped $SnO_2$ and the $SnO_2$/Ag/$SnO_2$, respectively. The multilayer transparent conductive film wherein the 2.59 wt % Mn-doped $SnO_2$ was used showed the most superior transmittance property (see FIG. 6). Based on these results, it can be concluded that the multilayer transparent conductive film wherein the 2.59 wt % Mn-doped $SnO_2$ is used exhibits low sheet resistance and high transmittance in the visible region even with a relatively small thickness and is applicable to various display devices including flexible devices.

What is claimed is:

1. A manganese tin oxide-based transparent conducting oxide film, wherein the manganese tin oxide has a composition $Mn_xSn_{1-x}O$ ($0<x\leq0.055$), and has an amorphous phase.

2. The manganese tin oxide-based transparent conducting oxide film according to claim 1, wherein x is 0.035~0.055.

3. The manganese tin oxide-based transparent conducting oxide film according to claim 1, wherein x is 0.045.

4. The manganese tin oxide-based transparent conducting oxide film according to claim 1, wherein a Root Mean Square surface roughness of the manganese tin oxide-based transparent conducting oxide film is 0.6~0.85 nm.

5. The manganese tin oxide-based transparent conducting oxide film according to claim 1, wherein a sheet resistance of the manganese tin oxide-based transparent conducting oxide film is 6.6~10.4 $\Omega/cm^2$.

6. The manganese tin oxide-based transparent conducting oxide film according to claim 1, wherein a transmittance of the manganese tin oxide-based transparent conducting oxide film is 82~86% for visible light.

7. The manganese tin oxide-based transparent conducting oxide according to claim 1, wherein the manganese tin oxide-based transparent conducting oxide is capable of being deposited on a substrate at room temperature.

8. The manganese tin oxide-based transparent conducting oxide film according to claim 7, wherein the substrate is a glass substrate or a polymer substrate.

9. The manganese tin oxide-based transparent conducting oxide film according to claim 8, wherein the polymer substrate is made of at least one selected from a group consisting of polyester, polyethylene, polycarbonate or polyethylene terephthalate.

10. A multilayer transparent conductive film, comprising:
    a first manganese tin oxide-based transparent conducting oxide film, wherein the first manganese tin oxide-based transparent conducting oxide has an amorphous phase and has a composition of $Mn_xSn_{1-x}O$ (0<x≤0.055);
    a metal thin film deposited on the manganese tin oxide-based transparent conducting oxide film; and
    a second manganese tin oxide-based transparent conducting oxide film, wherein the second manganese tin oxide-based transparent conducting oxide has an amorphous phase and has a composition of $Mn_xSn_{1-x}O$ (0<x≤0.055) deposited on the metal thin film, wherein the metal thin film has a thickness less than 100 nm.

11. The multilayer transparent conductive film according to claim 10, wherein x is 0.035-0.055.

12. The multilayer transparent conductive film according to claim 10, wherein x is 0.045.

13. The multilayer transparent conductive film according to claim 10, wherein the metal thin film is at least one selected from a group consisting of Ag, Au, Cu, Pd, Pt, Ni, Al, Y, La, Mg, Ca, Fe, Pb and Zn or an alloy thereof.

14. The multilayer transparent conductive film according to claim 10, wherein either of the first and the second manganese tin oxide-based transparent conducting oxide film has a thickness of 20-200 nm and the metal thin film has a thickness of 5-50 nm.

15. A method of manufacturing a manganese tin oxide film, the method comprising:
    obtaining a tin dioxide deposition target;
    obtaining a manganese dioxide deposition target; and
    simultaneously removing material from the tin dioxide deposition target and the manganese dioxide deposition target so as to deposit a film of manganese tin oxide on a substrate physically separated from the tin dioxide deposition target and the manganese dioxide deposition target, wherein the manganese tin oxide film has a composition of $Mn_xSn_{1-x}O$ (0<x≤0.055), and has an amorphous phase.

16. The method of claim 15, wherein the simultaneously removing material comprises providing radio frequency power to the tin dioxide deposition target and the manganese dioxide deposition target in a vacuum environment.

17. The method of claim 16, wherein the radio frequency power provided to the tin dioxide deposition target is greater than the radio frequency power provided to the manganese dioxide deposition target.

* * * * *